United States Patent
Kim et al.

(10) Patent No.: US 7,507,601 B2
(45) Date of Patent: Mar. 24, 2009

(54) ENCAPSULATED ORGANIC LUMINESCENT DISPLAY PANEL AND METHOD FOR MANUFACTURING THE SAME

(75) Inventors: Gi Heon Kim, Daejeon-Shi (KR); Sung Min Yoon, Daejeon-Shi (KR); In Kyu You, Daejeon-Shi (KR); Kyu Ha Baek, Daejeon-Shi (KR); Kyung Soo Suh, Daejeon-Shi (KR)

(73) Assignee: Electronics and Telecommunications Research Institute, Daejeon-Shi (KR)

( * ) Notice: Subject to any disclaimer, the term of this patent is extended or adjusted under 35 U.S.C. 154(b) by 450 days.

(21) Appl. No.: 11/270,471

(22) Filed: Nov. 10, 2005

(65) Prior Publication Data
US 2006/0054887 A1     Mar. 16, 2006

Related U.S. Application Data

(62) Division of application No. 10/887,510, filed on Jul. 9, 2004, now Pat. No. 7,061,012.

(30) Foreign Application Priority Data
Nov. 15, 2003     (KR)     ................................ 2003-80808

(51) Int. Cl.
*H01L 21/00*     (2006.01)
(52) U.S. Cl. ............................. 438/82; 438/99; 257/40; 257/98
(58) Field of Classification Search .................. 438/82, 438/99; 257/40, 98, 100, 642
See application file for complete search history.

(56) References Cited

U.S. PATENT DOCUMENTS

| 5,734,225 | A | 3/1998 | Biebuyck et al. |
| 5,962,962 | A | 10/1999 | Fujita et al. |
| 6,144,157 | A | 11/2000 | Rogers et al. |
| 6,268,695 | B1 | 7/2001 | Affinito |
| 6,280,559 | B1 * | 8/2001 | Terada et al. ................ 156/295 |

FOREIGN PATENT DOCUMENTS

| JP | 54-104788 | 8/1979 |
| JP | 10-134959 | 5/1998 |
| JP | 11-329717 | 11/1999 |
| KR | 00215768 | 5/1999 |
| KR | 1020030027796 | 4/2003 |

* cited by examiner

*Primary Examiner*—David Vu
*Assistant Examiner*—Thinh T Nguyen
(74) *Attorney, Agent, or Firm*—Lowe Hauptman Ham & Berner, LLP

(57) ABSTRACT

Provided is a display panel comprised of a white color organic luminescent element and a color filter for full color implementation, wherein a substrate in which an organic luminescent element is formed and a color filter are assembled and fixed to face each other with an adhesive pattern therebetween, and liquid oil is filled between the color filter and the substrate inside of the adhesive pattern so as to block external moisture or oxygen, so that deterioration of luminous characteristics due to the external moisture or oxygen may be prevented by encapsulating the organic luminescent element and the color filter with the liquid oil, which leads to enhance reliability and stability of the element, and also allows the encapsulation process to be performed with relatively simple steps and low cost.

8 Claims, 6 Drawing Sheets

ENCAPSULATED ORGANIC LUMINESCENT DISPLAY PANEL AND METHOD FOR MANUFACTURING THE SAME

CROSS REFERENCE TO RELATED APPLICATION

This application is a divisional of U.S. Ser. No. 10/887,510, filed on Jul. 9, 2004 now U.S. Pat. No. 7,061,012. This application, in its entirety, is incorporated herein by reference.

BACKGROUND

1. Field of the Invention

The present invention generally relates to a display panel Comprised of a white color organic luminescent element and a color filter, and More particularly, to an encapsulated organic luminescent display panel Capable of blocking external moisture or oxygen and method for fabricating the same.

2. Discussion of Related Art

In general, a low molecular organic luminescent element or high molecular organic luminescent element (hereinafter, it will be referred to as organic luminescent element) is comprised of an anode formed on a substrate, a hole transport layer for injecting holes to the organic luminescent layer, an organic luminescent layer formed on the hole transport layer, an electron injecting layer formed on the organic luminescent layer and for injecting electrons to the organic luminescent layer, and a cathode connected to the electron injecting layer, and when electrons and holes are injected into the organic luminescent layer through the electron injecting layer and the hole transport layer, the electrons and holes are combined in pairs in the organic luminescent layer to thereby emit light. That is, the light is emitted by energy irradiated during combination of the electrons and holes.

However, the above-mentioned organic luminescent element is apt to be deteriorated by internal or external factors, especially moisture or oxygen permeated from outside adversely affects luminous lifetime of the element. To cope with such problem, several attempts and technologies have been conducted and developed to ensure reliability and stability of the organic luminescent element.

One method for ensuring the reliability and stability of the organic luminescent element is an encapsulation method. The encapsulation method, which is most widely used in the art, includes employing a glass cap or a metal cap. After the metal cap or glass cap is cleaned and dried, a moisture absorbent (e.g., calcium oxide or barium oxide) is applied on the inside of the cap. Ultraviolet (UV) curing type adhesive in an inactive gas atmosphere is employed to allow the cap to be fixed to the substrate (typically, glass) where the organic luminescent element is formed. However, such encapsulation method uses the glass cap or metal cap, so that it is difficult to accomplish a light weight and a thin thickness and many processing time is required. In addition, a large area of the display panel may not be properly encapsulated due to the weight of the cap, and the organic luminescent element with its cap may not be bent.

To help overcome the encapsulation method using the metal cap or glass cap, an encapsulation method using a plastic cap (such as Korean Patent Publication No. 1999-88334), encapsulation methods using physical vacuum deposition or chemical vacuum deposition (such as Korean Patent Publication Nos. 1999-31394, and 1999-38057, U.S. Pat. Nos. 5,188,901, 6,268,695, 6,224,948, 6,207,239, 6,228,436, 5,902,641, 6,217,947, 6,203,854, 5,547,508, and 5,395,644), and so forth have been proposed. However, these conventional methods should still use high-priced equipments (physical/chemical vacuum chamber, vacuum pump, etc.), and they may not be readily applied to an organic luminescent element having a large area.

In addition to the above-mentioned methods, encapsulation methods for spin coating or molding siloxane based high molecule on an organic luminescent element (such as U.S. Pat. No. 5,855,994 to Hans Biebuyck, et al, U.S. Pat. No. 5,734,225, Korean Patent Publication Nos. 1999-44520, 2000-23573), encapsulation methods for applying photo reactive acrylate monomer or initiator on an organic luminescent element by means of spin coating and then forming a cured thin film through light irradiation thereon (such as Korean Patent Nos. 2002-45479, 2002-20908, 2002-75406), and so forth have been proposed. These methods may have an advantage of readily ensuring processibility, however, have a disadvantage that good encapsulation may be implemented with a single high molecular thin film due to high moisture retention and oxygen permeability of the high molecular thin film.

SUMMARY OF THE INVENTION

The present invention is directed to an encapsulated organic luminescent display panel in which external moisture or oxygen may be effectively blocked by means of a relatively simple process and a low cost, and method for fabricating the same.

One aspect of the present invention is to provide a method for fabricating an encapsulated organic luminescent display panel, which comprises the steps of preparing a substrate in which an organic luminescent element including an anode, a cathode, and a light emitting layer is formed, and a color filter in which a plurality of color patterns are formed, respectively; forming an adhesive pattern including at least one opening along a circumferential portion of the color filter or the substrate; assembling the substrate and the color filter to face each other to complete fabrication of the organic luminescent display panel; dipping the organic luminescent display panel into a container containing liquid oil to fill a space between the substrate and the color filter with the liquid oil through the opening; and blocking the opening so as to suppress the liquid oil from flowing outside.

Another aspect of the present invention is to provide a method for fabricating an encapsulated organic luminescent display panel, which comprises the steps of: preparing a transparent substrate in which an organic luminescent element including an anode, a cathode, and a light emitting layer is formed, and a color filter in which a plurality of color patterns are formed, respectively; forming an adhesive pattern along a circumferential portion of the color filter or the substrate; dropping liquid oil in a space to be formed by the adhesive pattern in a central portion of the color filter or the transparent substrate; and assembling the transparent substrate and the color filter to face each other to fill the space with the dropped liquid oil being spread.

DETAILED DESCRIPTION OF PREFERRED EMBODIMENTS

Figure 1:
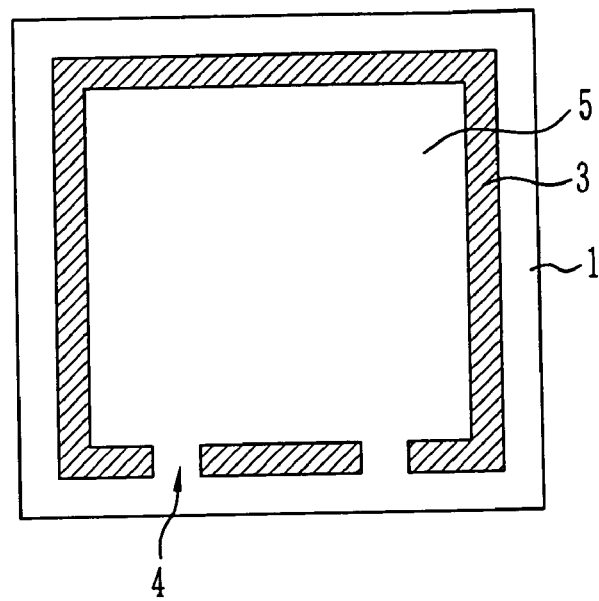
FIG. 1 to FIG. 7 are view illustrating a method for fabricating an encapsulated organic luminescent display panel in accordance with an embodiment of the present invention.

The present invention will now be described more fully hereinafter with reference to the accompanying drawings, in which exemplary embodiments of the field emission device are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

In recent years, methods for forming respective R, G, and B pixels of an organic luminescent element are widely researched, and methods for employing a white color organic luminescent element as a backlight and attaching a color filter in which color patterns (R, G and B) are formed for full color implementation to the white color luminescent element are also researched. The present invention provides an effective encapsulation method and a structure when the display panel is comprised of a color filter having color patterns and a substrate having the white color organic luminescent element. In particular, the present invention provides an encapsulation method for filling liquid oil, which is capable of remarkably blocking external moisture or oxygen, in the color filter and the organic luminescent element between the substrate and the color filter after a plastic substrate or glass substrate in which the white color organic luminescent element is formed and the color filter are assembled.

Hereinafter, an exemplary embodiment of the present invention will be described in detail with reference to accompanying drawings.

First Embodiment

Figure 2:
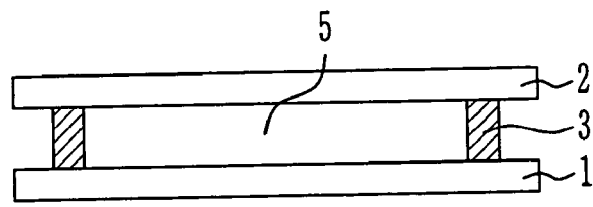

Referring to FIG. 1 and FIG. 2, an anode electrode, a hole transport layer for injecting holes, an organic light emitting layer, an electron transport layer for injecting electrons, and a cathode electrode are sequentially stacked on a transparent substrate 1 formed of a transparent glass or plastic material to thereby form an organic luminescent element. The anode electrode may be formed of a transparent material such as Indium tin oxide (ITO), Indium zinc oxide (IZO), and so forth.

In addition, a number of color patterns (R, G and B) are arranged on another substrate to thereby form a color filter 2.

An adhesive pattern 3 is formed along a circumferential portion of the color filter 2 or the transparent substrate 1. The adhesive pattern 3 is formed long with a predetermined width along the circumferential portion of the color filter 2 or the transparent substrate 1 as shown in FIG. 1, and has at least one opening 4 in its predetermined portion. The adhesive pattern 3 may be formed of an epoxy-based adhesive, an acrylate-based adhesive, and so forth, and such adhesive may be cured by heat or ultraviolet (UV) after it is applied or coated. Number and size of the opening 4 is determined in consideration of a substrate size, viscosity or type of liquid oil to be used. In this case, a spacer having a predetermined thickness may be formed on the adhesive pattern 3 so as to constantly maintain the space between the transparent substrate 1 and the color filter 2.

Figure 3:
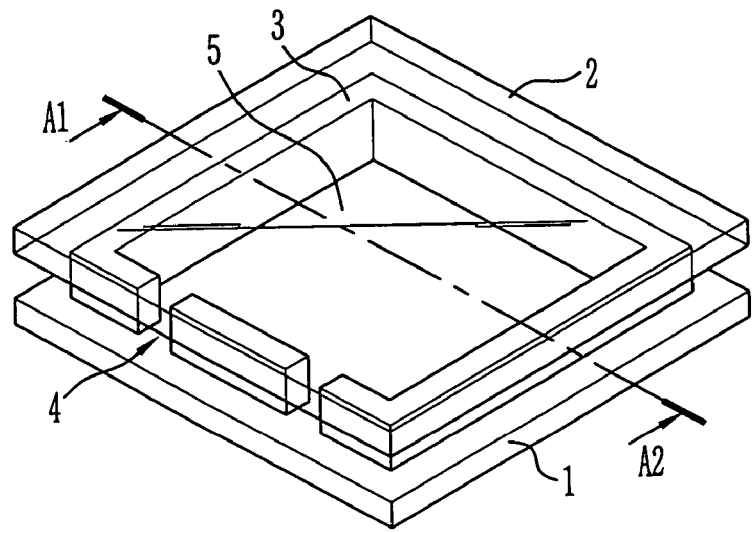

Referring to FIG. 3, in order to implement full color by means of the white color organic luminescent element having the above-mentioned configuration, the transparent substrate 1 and the color filter 2 are assembled to face each other. In this case, the transparent substrate 1 and the color filter 2 are fixed each other by the adhesive pattern 3, and a predetermined space 5 is formed in the color filter and the organic luminescent element between the transparent substrate 1 and the color filter 2. A cross section taken along the line A1-A2 of FIG. 3 is the same as FIG. 2.

Figure 4:
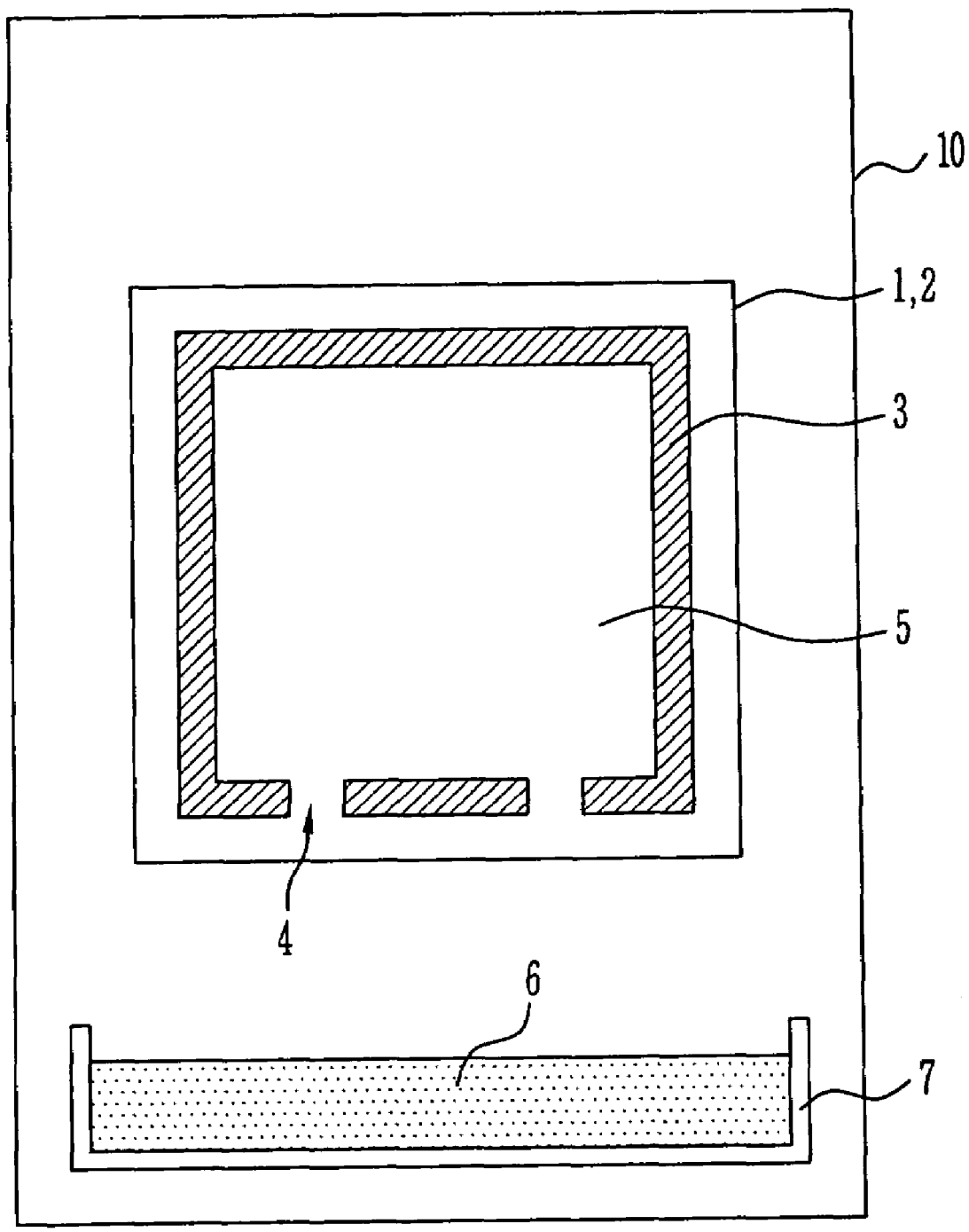

Referring to FIG. 4, after the display panel comprised of the transparent substrate 1 and the color filter 2 as mentioned above is moved into a vacuum chamber 10, a vacuum state is maintained to remove air filled in the space 5 between the transparent substrate 1 and the color filter 2. In this case, a container 7 containing liquid oil is prepared within the vacuum chamber 10. The liquid oil 6 may have a basic structure of at least one among polyphenyl-methyl siloxane, polydiphenyl siloxane, polydimethyl siloxane, silicon oil, paraffin oil, mineral oil, almond oil, corn oil, cottonseed oil, perfluoropolyether oil, linseed oil, tung oil, castor oil, cinnamin oil, and coconut oil, which are remarkably capable of blocking external moisture or oxygen.

Figure 5:
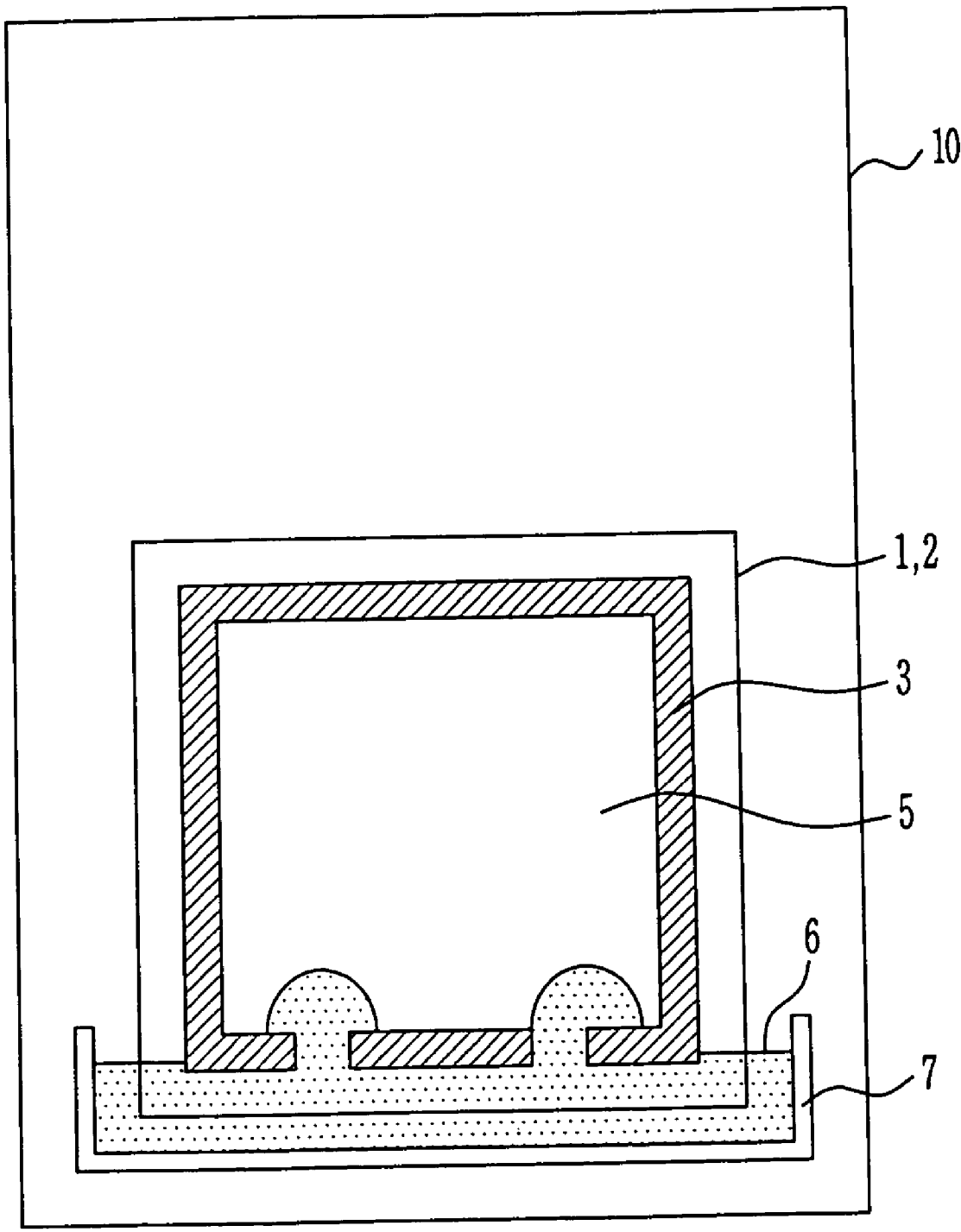

Referring to FIG. 5, when the display panel is dipped into the container 7 so as to have the opening 4 of the adhesive pattern 3 dipped in the liquid oil 6, capillarity causes the liquid oil 6 to gradually fill the space 5 from its bottom.

Figure 6:
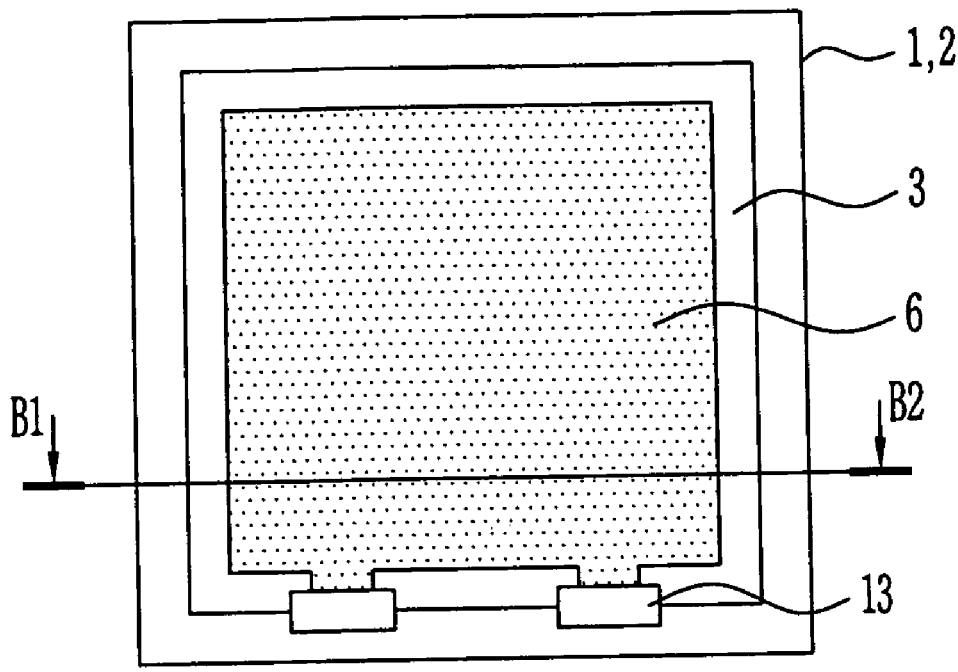
Figure 7:
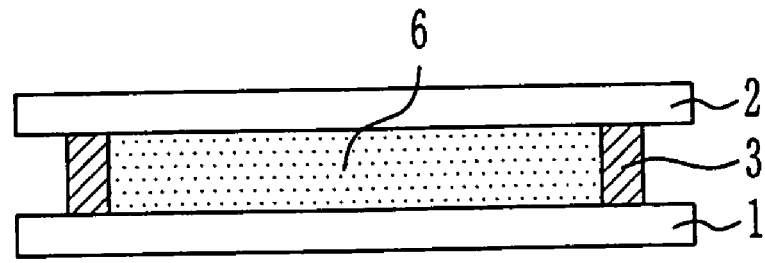

Referring to FIG. 6, when the liquid oil 6 is fully filed in the space 5 after a predetermined time, the opening 4 is blocked by the adhesive 13 so that the liquid oil 6 doest not flow out of the display panel. FIG. 7 shows a cross sectional view of the fabricated organic luminescent display panel taken along the line B1-B2 of FIG. 6

Second Embodiment

Figure 8:
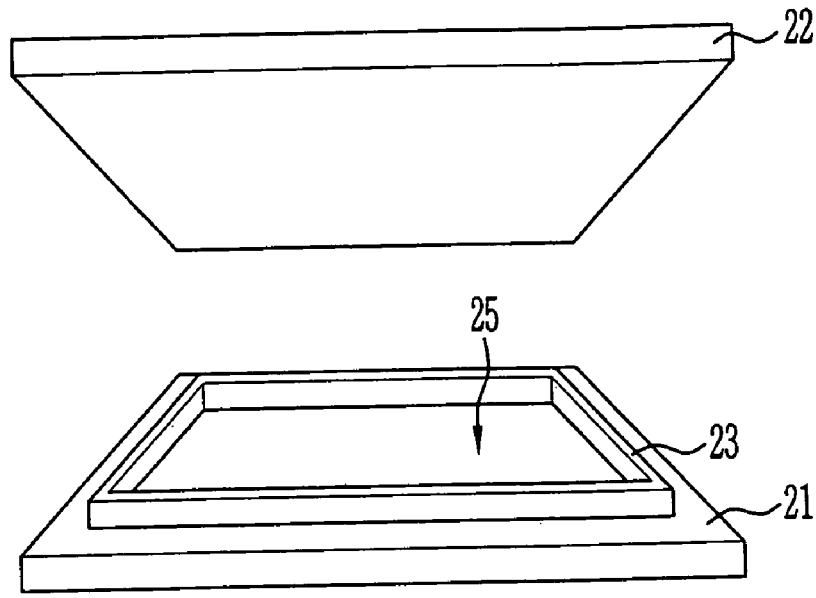
FIG. 8 to FIG. 11 are view illustrating a method for fabricating an encapsulated organic luminescent display panel in accordance with another embodiment of the present invention.

Referring to FIG. 8, an anode electrode, a hole transport layer for injecting holes, an organic light emitting layer, an electron transport layer for injecting electrons, and a cathode electrode are sequentially stacked on a transparent substrate 21 formed of a transparent glass or plastic material to thereby form an organic luminescent element.

In addition, a number of color patterns (R, G and B) are arranged on another substrate to thereby form a color filter 22.

An adhesive pattern 23 is formed along a circumferential portion of the color filter 22 or the transparent substrate 21. The adhesive pattern 23 is formed long with a predetermined width along the circumferential portion of the color filter 22 or the transparent substrate 21. Thus, a space 25 is formed to be surrounded by the adhesive pattern 23 in the organic luminescent element and the color filter. The adhesive pattern 3 may be formed of an epoxy-based adhesive, an acrylate-based adhesive, and so forth, and such adhesive may be cured by heat or ultraviolet (UV) after it is applied or coated. In this case, a spacer having a predetermined thickness may be formed on the adhesive pattern 23 so as to constantly maintain the space between the transparent substrate 21 and the color filter 22.

Figure 9:
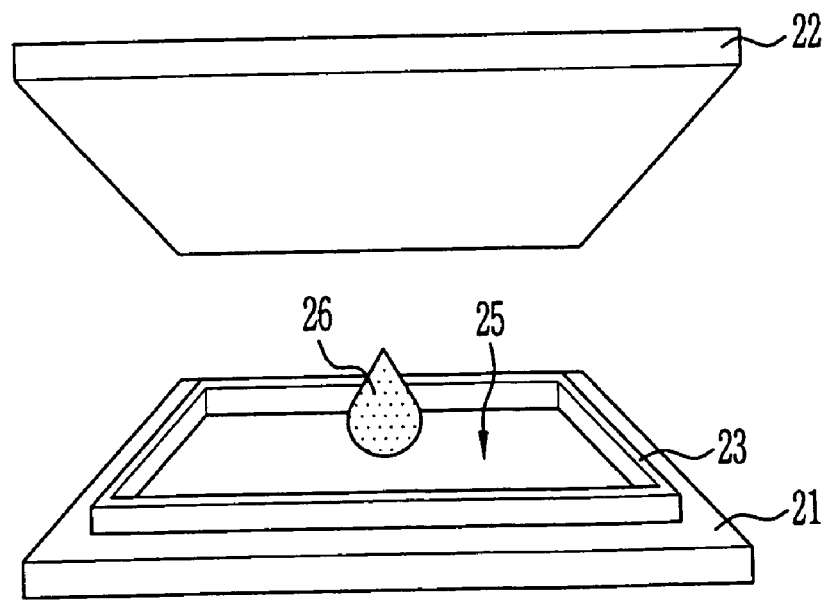

Referring to FIG. 9, a predetermined amount of liquid oil 26 is dropped in the space 25 formed by the adhesive pattern 23 in a central portion of the color filter 22 or the transparent substrate 22.

Figure 10:
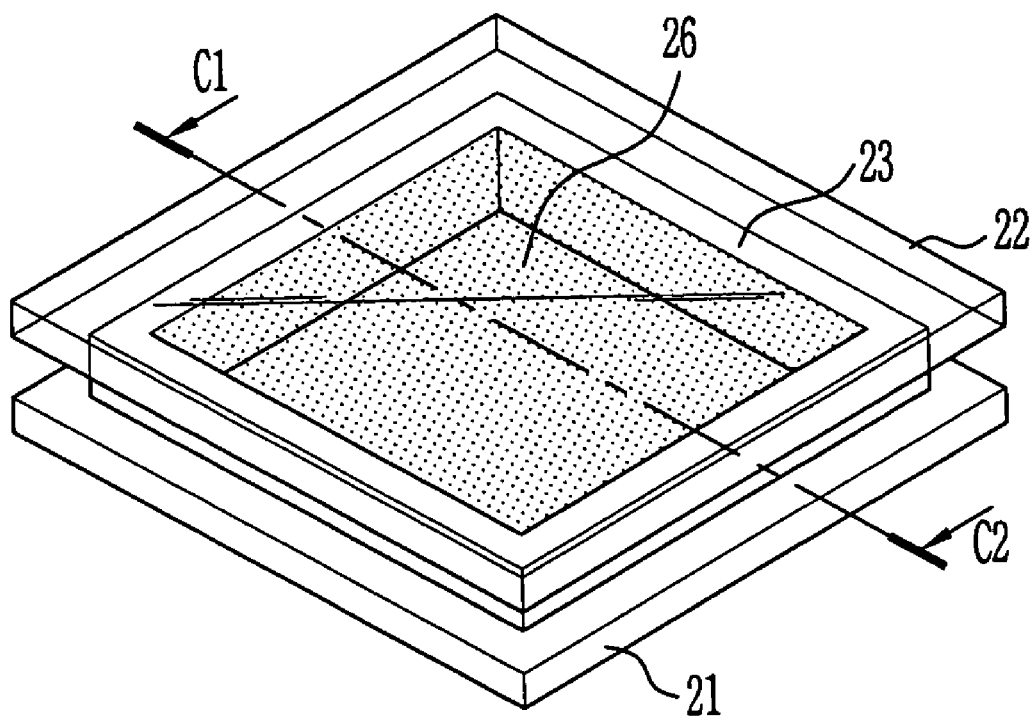
Figure 11:
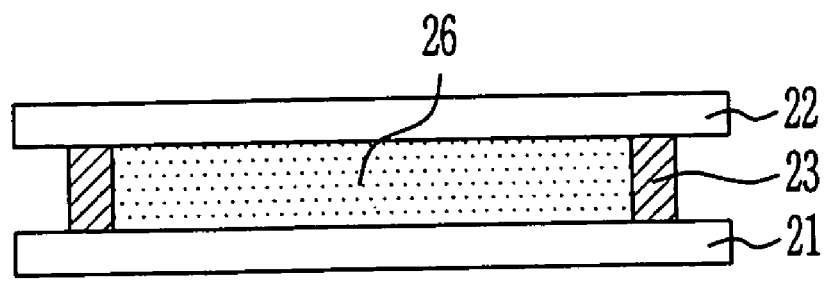

Referring to FIG. 10, in order to implement full color by means of a white color organic luminescent element, the transparent substrate 21 and the color filter 22 are assembled to face each other. In this case, the transparent substrate 21 and the color filter 22 are fixed each other by the adhesive pattern 23, and dropped liquid oil is spread between the transparent substrate 21 and the color filter 22 to fill the space 25. FIG. 11 shows a cross section taken along the line C1-C2 of the fabricated organic luminescent display panel as shown in FIG. 10.

In the present invention, an adhesive including a moisture absorbent in which at least one of calcium, silica gel, zeolite, and alkali metal is contained may be used in order to form the adhesive patterns 3 and 23, and a separate moisture absorbing layer may be additionally interposed between the substrates 1 and 21 and the adhesive patterns 3 and 23 to thereby enhance lifetime of the organic luminescent display panel.

As mentioned above, the color filter and substrate in which organic luminescent elements are formed are assembled and fixed to face each other with an adhesive pattern being interposed therebetween, and liquid oil is filled to block external moisture or oxygen between the color filter and the substrate inside of the adhesive pattern. As a result, first, a relatively simple process and a low cost may be obtained to effectively encapsulate the display panel without requiring high-priced encapsulation equipment. Second, liquid oil, which is capable of remarkably blocking external moisture or oxygen, is employed to encapsulate the display panel so that reliability and stability of element are enhanced. Third, the present invention may be applied to a display panel with a large area using an organic luminescent element, which facilitates fabrication of the display panel and application of a flexible display panel. Fourth, a moisture absorbent (such as calcium, silica gel, zeolite, alkali metal and so forth) used in the present invention may be added, or a separate moisture absorbing layer may be interposed between the adhesive and the substrate, so that lifetime of the organic luminescent display panel may be enhanced.

While the present invention has been described with reference to a particular embodiment, it is understood that the disclosure has been made for purpose of illustrating the invention by way of examples and is not limited to limit the scope of the invention. And one skilled in the art can make amend and change the present invention without departing from the scope and spirit of the invention.

What is claimed is:

1. A method for fabricating an encapsulated organic luminescent display panel, the method comprising the steps of:
    a) preparing a substrate in which an organic luminescent element including an anode, a cathode, and a light emitting layer is formed, and a color filter in which a plurality of color patterns are formed, respectively;
    b) forming an adhesive pattern including at least one opening along a circumferential portion of the color filter or the substrate;
    c) assembling the substrate and the color filter to face each other to complete fabrication of the organic luminescent display panel;
    d) dipping the organic luminescent display panel into a container containing liquid oil to gradually fill a space between the substrate and the color filter with the liquid oil through the opening via capillary action; and
    e) blocking the opening so as to suppress the liquid oil from flowing outside.

2. The method as claimed in claim 1, further comprising a step of: removing air remaining in the space between the substrate and the color filter after performing the step (c).

3. The method as claimed in claim 1, wherein the step (d) is performed in a vacuum chamber.

4. The method as claimed in claim 1, wherein the opening is blocked by an adhesive in the step (e).

5. The method as claimed in claim 1, wherein the adhesive pattern is formed of any one of an epoxy-based adhesive and an acrylate-based adhesive.

6. The method as claimed in claim 1, wherein the adhesive pattern further includes a moisture absorbent.

7. The method as claimed in claim 1, further comprising a step of: forming a space with a predetermined thickness on the adhesive pattern.

8. The method as claimed in claim 1, wherein the liquid oil has a basic structure of at least one among polyphenyl-methyl siloxane, polydiphenyl siloxane, polydimethyl siloxane, silicon oil, paraffin oil, mineral oil, almond oil, corn oil, cottonseed oil, perfluoropolyehter oil, linseed oil, tung oil, castor oil, cinnamin oil, and coconut oil.

* * * * *